(12) United States Patent
Maier

(10) Patent No.: US 11,062,972 B2
(45) Date of Patent: Jul. 13, 2021

(54) ELECTRONIC MODULE FOR POWER CONTROL AND METHOD FOR MANUFACTURING AN ELECTRONIC MODULE POWER CONTROL

(71) Applicant: ZF FRIEDRICHSHAFEN AG, Friedrichshafen (DE)

(72) Inventor: Thomas Maier, Neunburg v. Wald (DE)

(73) Assignee: ZF FRIEDRICHSHAFEN AG, Friedrichshafen (DE)

( * ) Notice: Subject to any disclaimer, the term of this patent is extended or adjusted under 35 U.S.C. 154(b) by 0 days.

(21) Appl. No.: 16/378,225

(22) Filed: Apr. 8, 2019

(65) Prior Publication Data

US 2019/0311968 A1 Oct. 10, 2019

(30) Foreign Application Priority Data

Apr. 9, 2018 (DE) .......................... 102018205243.3

(51) Int. Cl.
| | |
|---|---|
| *H01L 23/367* | (2006.01) |
| *H01L 25/07* | (2006.01) |
| *H01L 23/373* | (2006.01) |
| *H01L 25/18* | (2006.01) |

(52) U.S. Cl.
CPC ...... *H01L 23/3675* (2013.01); *H01L 23/3735* (2013.01); *H01L 25/072* (2013.01); *H01L 25/18* (2013.01); *H01L 23/3736* (2013.01)

(58) Field of Classification Search
CPC ............. H01L 23/3675; H01L 23/3735; H01L 25/072; H01L 25/18
See application file for complete search history.

(56) References Cited

U.S. PATENT DOCUMENTS

| | | | |
|---|---|---|---|
| 7,813,135 B2* | 10/2010 | Mori | H01L 23/473 361/719 |
| 2003/0198022 A1 | 10/2003 | Ye et al. | |
| 2007/0057284 A1* | 3/2007 | Casey | H01L 23/5385 257/177 |
| 2008/0291636 A1* | 11/2008 | Mori | H01L 23/3735 361/709 |

FOREIGN PATENT DOCUMENTS

| | | |
|---|---|---|
| DE | 4410467 A1 | 1/1995 |
| DE | 102010001958 A1 | 8/2011 |
| DE | 102013212446 A1 | 1/2015 |
| DE | 102014201032 A1 | 7/2015 |
| EP | 2043412 A1 | 4/2009 |

OTHER PUBLICATIONS

Search Report for German Application No. 10 2018 205 243.3, created Jan. 20, 2019.

* cited by examiner

*Primary Examiner* — Marc Anthony Armand
(74) *Attorney, Agent, or Firm* — Brinks Gilson & Lione

(57) ABSTRACT

The invention relates to an electronics module (100) for power control. The electronics module (100) comprises a carrier element (102), which has at least a first power switch element (104) with a first cooling surface (106) and a second power switch element (108) with a second cooling surface (110), a heat sink (126), and a cooling plate (122), which connects the first cooling surface (105) and the second cooling surface (110) to one another as well as to the heat sink (126) in a thermally conductive manner, when the electronics module (100) is installed.

20 Claims, 2 Drawing Sheets

ELECTRONIC MODULE FOR POWER CONTROL AND METHOD FOR MANUFACTURING AN ELECTRONIC MODULE POWER CONTROL

RELATED APPLICATIONS

This application claims the benefit of priority under 35 U.S.C. § 119(a) of German Application No. 10 2018 205 243.3, filed Apr. 9, 2018, the content of which is incorporated herein by reference in its entirety.

FIELD

The present invention relates to an electronics module for power control and a method for producing an electronics module for power control.

DESCRIPTION OF RELATED ART

A major challenge in the production of electronics modules, e.g. for transmission or power control in vehicles, is the increasing miniaturization of electronic components. There is a desire to obtain more power in increasingly smaller installation spaces, resulting in high demands in terms of heat dissipation.

For an efficient heat dissipation, the components can be coupled to a heat sink via heat conducting intermediate elements.

SUMMARY

Based on this, the present invention creates an improved electronics module and an improved method for producing an electronics module according to the independent claims. Advantageous embodiments can be derived from the dependent claims and the following description.

The approach described herein is based on the knowledge that by thermally coupling a group of power switch elements of an electronics module, e.g. MOSFETs, to a common cooling plate, a heat dissipation can be obtained in the cooling plate, in which the regions between the individual power switch elements can also be used for heat dissipation. As a result, more heat can be dissipated than with technological solutions in which each power switch element has a separate dedicated cooling plate.

An electronics module for power control that has the following features is presented:

a carrier element that has at least one first power switch element with a first cooling surface and a second power switch element with a second cooling surface;

a cooling element; and a cooling plate, that connects the first cooling surface and the second cooling surface to one another, as well as to the cooling element in a thermally conductive manner, when the electronics module is installed.

An electronics module can be a module for controlling a transmission, in particular a vehicle transmission, or a power electronics module. A carrier element can be a printed circuit board, for example, also referred to as a circuit board or PCB (Printed Circuit Board). The carrier element can be populated with electronic components on one or both sides, depending on the embodiment. A power switch element can be an electronic switch, e.g. a MOSFET or some other semiconductor power switch. In particular, the first and second power switch elements can be outputs of an amplifier circuit. The first and second power switch elements can be connected in parallel to one another. The first and second cooling surfaces can be surface sections of a surface of the first and second power switch elements facing away from the carrier element. A cooling plate can be a plate made of a material with comparatively high thermal conductivity, in particular a metal plate, e.g. a copper plate or a plate made of some other appropriate metal. The cooling plate can also be a composite of different materials. A heat sink can be understood in general to be an element that functions as a cooling element, which can absorb and discharge heat particularly well, due to its geometry or the nature of its materials. By way of example, the heat sink can be a housing for the electronics module or at least a section thereof. The heat sink can also be a separate component, e.g. a transmission component or some other part of a vehicle that functions as a heat sink. The heat sink can also be a metal insert that can be placed in an injection molded component.

According to one embodiment, the first power switch element and/or the second power switch element can be a MOSFET, IGBT, or a thyristor. Additionally or alternatively, the first and second power switch elements can be connected to one another in parallel. This embodiment enables an efficient power control with the most compact possible structural size of the electronics module.

According to another embodiment, the cooling plate can be at least mostly made of copper, and/or comprise copper as the main component. By way of example, the cooling plate can be a copper plate or piece of copper sheet metal. Alternatively, the cooling plate can be made of an alloy containing copper. As a result, a more efficient heat dissipation is obtained with comparatively low production costs.

The electronics module according to another embodiment can be a connecting element that has a filler material with a predefined thermal resistance. The connecting element can be designed to connect the cooling plate and the heat sink to one another in a thermally conductive manner when the electronics module is installed. A filler material can be a so-called gap filler, for example, with pre-defined mechanical and chemical properties; by way of example, the filler material is selected on the basis of these properties. The connecting element can be film, plate, or paste. As a result of this embodiment, the efficiency of the heat dissipation can be further increased.

The electronics module can also have an electrical insulating layer, designed to connect the connecting element and the heat sink to one another in a thermally conductive manner when the electronics module is installed. An insulating layer can be understood in general to be a heat conducting, but electrically insulating layer. The insulating layer can be applied, at least in part, to the surface of the heat sink during the production thereof, e.g. through anodizing. The efficiency of the heat dissipation can also be further increased through this embodiment.

Depending on the embodiment, the connecting element can have a predefined elasticity and/or it can be self-adhering and/or it can be removed without residue and/or it can be electrically conductive and/or it can be in the form of a thermally conductive film. By way of example, the connecting element can be selected concretely on the basis of or by defining the (desired) elasticity. Additionally or alternatively, the insulation layer can be a metallic oxide layer. As a result of this embodiment, the effort required for producing, installing or removing the electronics module can be reduced. Furthermore, irregularities in the respective surface quality of the heat sink and the cooling plate can be compensated for in a simple manner as a result.

According to another embodiment, the cooling plate can be materially bonded to the first cooling surface and/or the second cooling surface, in particular by soldering and/or adhesive. This results in a significant improvement in the thermal conductivity between the first cooling surface and the cooling plate or between the second cooling surface and the cooling plate.

Furthermore, the electronics module can have a housing for accommodating the electronics module. The housing can be made of plastic or metal, or both, for example. By way of example, the housing can be fluid-tight. As a result of this embodiment, the electronics module can be protected against environmental effects and mechanical damage.

The heat sink can be part of the housing. As a result, the electronics module can be extremely compact.

It is particularly advantageous when the housing is formed by spraying the electronics module with a housing material. A housing material can be a plastic or a composite containing plastic.

As a result, the housing can be produced particularly inexpensively and in a compact manner.

The approach presented herein lastly provides a method for producing an electronics module for power control, wherein the method comprises the following steps:

placing a cooling plate between a heat sink and a carrier element, which has at least a first power switch element with a first cooling surface and a second power switch element with a second cooling surface; and connecting the cooling plate to the first cooling surface, the second cooling surface and the heat sink in a thermally conductive manner in order to produce the electronics module.

A computer program with program code is also advantageous, which can be stored on a machine-readable carrier, e.g. a semiconductor memory, a hard disk memory, or an optical memory, and can be used for executing the method according to any of the embodiments described above, when the program is executed on a computer or a device.

BRIEF DESCRIPTION OF THE DRAWINGS

The invention shall be explained in greater detail based on the attached drawings. Therein.

DETAILED DESCRIPTION

In the following description of preferred exemplary embodiments of the present invention, the same or similar reference symbols are used for the elements shown in the various figures and having similar functions, wherein the descriptions of these elements will not be repeated.

Figure 1:
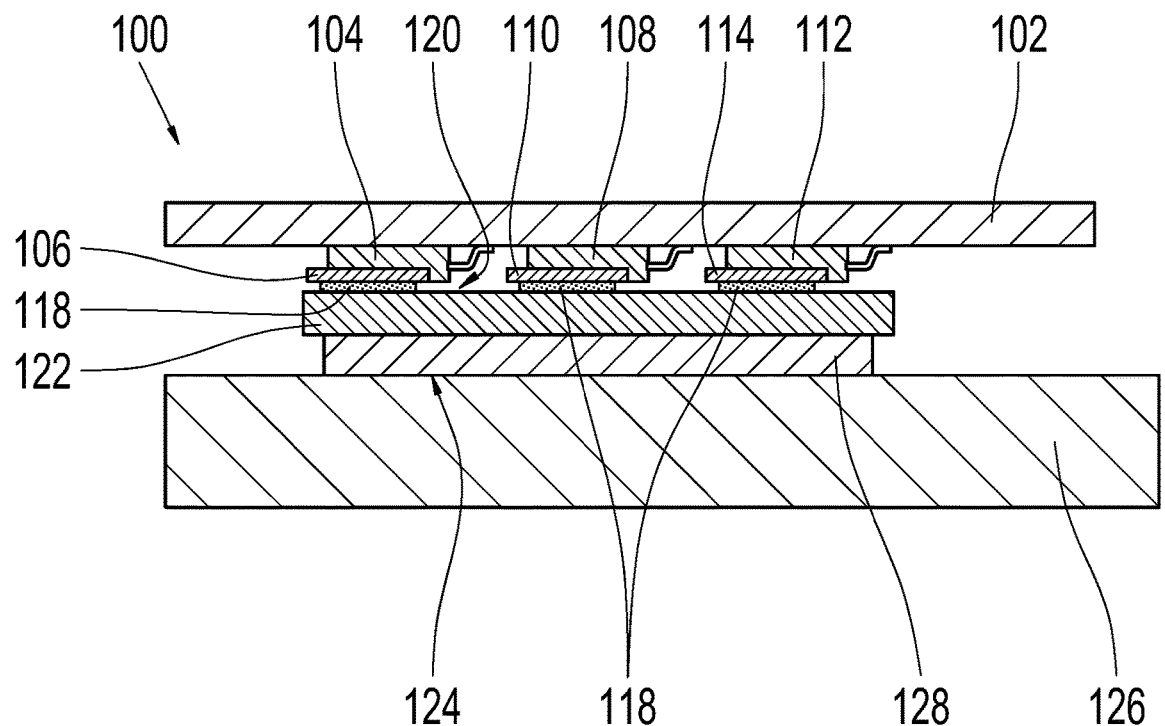
FIG. 1 shows a schematic cross section view of an electronics module according to one exemplary embodiment of the present invention.

FIG. 1 shows a schematic cross section of an electronics module 100 for power control according to an exemplary embodiment of the present invention. The electronics module 100, e.g. a component of an electric control device or a power electronics element for an (electric) vehicle, comprises a carrier element 102, also referred to as a circuit carrier, populated according to this exemplary embodiment on one side with a first power switch element 104 with a first cooling surface 106, a second power switch element 108 with a second cooling surface 110, and a third power switch element 112 with a third cooling surface 114. The cooling surfaces 106, 110, 114 dissipate heat via respective surfaces of the power switch elements 104, 108, 112 facing away from the carrier element 102, also referred to as Top Side Cooling. The power switch elements 104, 108, 112 are MOSFET outputs.

By way of example, the three cooling surfaces 106, 110, 114 are connected in a thermally conductive manner to a first contact surface 120 of a cooling plate 122, e.g. a copper plate, through soldering at a soldering point 118. Alternatively, the cooling surfaces 106, 110, 114 are materially bonded to the first contact surface 120 with adhesive. As a result, the cooling surfaces 106, 110, 114 are thermally coupled to one another via the cooling plate 122. Because the cooling plate 122 also extends over regions of the carrier element 102 lying between the power switch elements 104, 108, 112, the heat dissipation via the cooling plate 122 is particularly efficient, because an overall surface of the cooling plate 122 is significantly larger than an overall surface of the cooling surfaces 106, 110, 114 or an overall surface of separate cooling plates attached to each of the power switch elements.

A second contact surface 124 of the cooling plate 122 lying opposite the first contact surface 120 forms a thermally conductive contact for a heat sink 126, formed, for example, by a section of the undersurface of the housing for the electronics module 100, e.g. a heat sink or a cooling element.

According to this exemplary embodiment, the heat sink 126 and the cooling plate 122 are thermally coupled to one another via an optional connecting element 128 in the form of a gap filler. This is a solid or paste-like filler, in particular, through which a thermal resistance between the cooling plate 122 and the heat sink 126 is minimized. The gap filler can be compressed, and is elastic. As a result, the formation of gaps caused by tolerances, differences in installation space, or different expansion coefficients between the cooling plate 122 and the heat sink is permanently prevented. As a result of the defined elasticity of the gap filler, a corresponding pressure is exerted toward the heat sink 126 on a boundary surface of the cooling plate 122. Consequently, a particularly efficient thermal attachment can be obtained with less pressure. Furthermore, the gap filler can also be self-adhering, resulting in a simple pre-assembly. The gap filler may also be able to be removed without residue, depending on the embodiment. As a result, the electronics module 100 can be removed easily.

With such a concept for the thermal attachment of the power switch elements 104, 108, 112 to the heat sink 126, here in the form of a thermally conductive interconnection, comprising the cooling surfaces 106, 110, 114, the soldering points 118, the cooling plate 122 and the connecting element 128, a particularly efficient heat dissipation can be obtained with an extremely compact structure of the electronics module 100.

Figure 2:
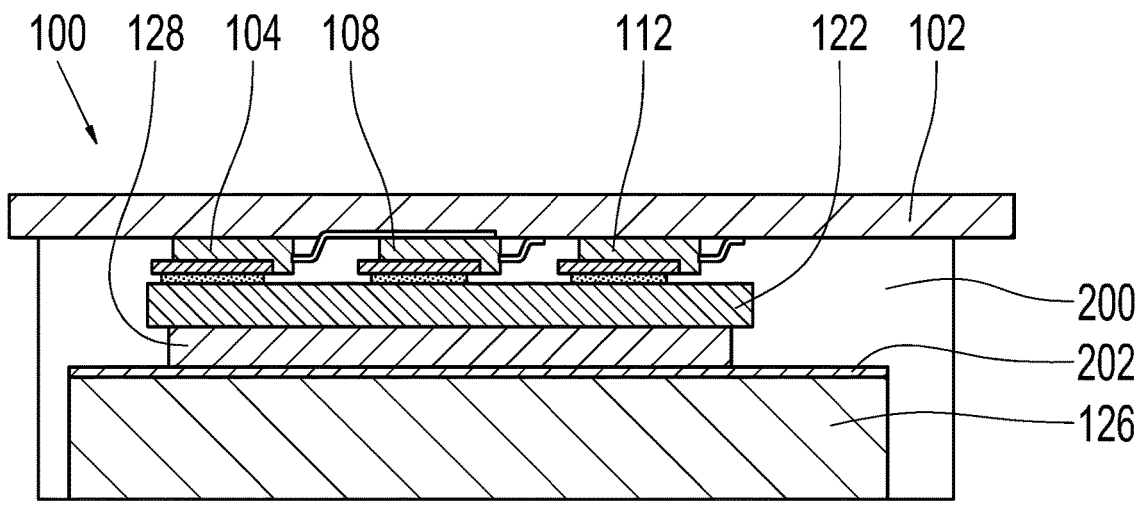
FIG. 2 shows a schematic cross section view of an electronics module according to another exemplary embodiment of the present invention.

FIG. 2 shows a schematic cross section of an electronics module 100 according to another exemplary embodiment of the present invention. The structure of the electronics module 100 shown in FIG. 2 corresponds substantially to the structure described above in reference to FIG. 1, with the difference that the electronics module 100 also has a housing 200 here, for accommodating components of the electronics module 100. The housing 200 encompasses most of the combination comprising the power switch elements 104, 108, 112, the cooling plate 122, the connecting element 128, and the heat sink 126. A surface section of the heat sink 126 facing away from the carrier element 102 is exposed, in order to enable an unobstructed heat exchange with the environment of the electronics module 100.

The housing 200 is formed, for example, by spraying the electronics module 100 with an appropriate housing material, e.g. a thermosetting plastic or some other suitable plastic, or composite containing plastic.

In addition, a surface section of the heat sink 126 facing toward the carrier element 102 is coated with an electrically insulating layer 202. The insulating layer 202 is obtained by anodizing the heat sink 126 with a metallic oxide layer, also referred to as an anodizing layer. In particular in combination with an electrically conductive connecting element 128, a particularly efficient heat dissipation is obtained via the heat sink 126 in this manner.

The approach presented herein shall be summarized below. The approach relates to a structural concept that enables the power losses from semiconductors to be dissipated efficiently and in a space-saving manner.

In particular in power electronics, there is a demand for more outputs, e.g. in the form of MOSFETs, to be connected in parallel, due to the high-power output. As described above, the power losses of the power switch elements 104, 108, 112 can be dissipated, e.g. via the connecting element 128, composed of an electrically insulating, thermally conductive material, also referred to as a gap filler, to a heat sink, e.g. an (aluminum) base of the housing 200 functioning as a heat sink 126. The substantial thermal resistance is determined by the following parameters: the thermal conductivity of the connecting element 128, the distance between the power switch elements and the heat sink, i.e. to the heat sink 126, and the sizes of the cooling surfaces 106, 110, 114.

Because available gap filler materials that can be readily processed are limited with regard to their conductivity, e.g. to ca. 5 W/mK, and the distance cannot be substantially reduced due to the tolerances in the overall system, e.g. component tolerances or heat sink tolerances, the only available measure for improvement is increasing the surface area.

According to one particularly beneficial exemplary embodiment of the present invention, a copper sheet in the form of a copper plate 122 is soldered to the power switch elements 104, 108, 112, in order to thus obtain a substantially larger thermal surface area. Because the soldering connection is very thermally conductive, the heat that is to be dissipated is transferred efficiently to the copper plate, which dissipates the heat efficiently, due to its effective thermal conductivity.

If an insulating gap filler in the form of a connecting element is also subsequently attached to the cooling plate 122, a substantially better thermal conductivity of the overall system is obtained due to the substantially greater effective surface area, despite a somewhat greater distance due to the additional tolerance of the cooling plate 122.

Instead of copper sheet metal, other materials that can be soldered or attached with adhesive can also be used.

Insulating, thermally conductive materials, e.g. thermal films, can be used as the gap filler.

As a result of additional anodizing of the heat sink 126, i.e. by forming an electrically insulating oxide layer serving as the insulating layer 102, it is possible to use electrically conductive gap filler materials, which have a substantially higher thermal conductivity.

Optionally, the construction is sprayed, as shown in FIG. 2.

The heat sink 126 is designed, for example, as a component of a radiator.

Figure 3:
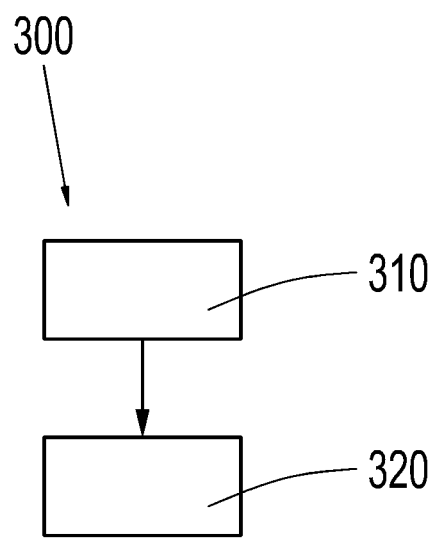
FIG. 3 shows a flow chart for a method for producing an electronics module according to an exemplary embodiment of the present invention.

FIG. 3 shows a flow chart for a method 300 for producing an electronics module according to an exemplary embodiment, e.g. the electronics module described above in reference to FIGS. 1 and 2. In a first step 310, the cooling plate is placed between the heat sink and the carrier element, such that the cooling plate lies opposite the respective cooling surfaces of the power switch elements at one side, and opposite the heat sink at the other side. In a second step 320, the cooling plate is connected in a thermally conductive manner to both the cooling plate and the cooling surfaces, as well as the heat sink, in order to produce the electronics module.

The exemplary embodiments described herein and shown in the figures are selected merely by way of example. Different exemplary embodiments can be combined with one another, entirely or with regard to individual features. Furthermore, one exemplary embodiment can also be supplemented by the features of another exemplary embodiment.

Furthermore, the method steps according to the invention can be repeated, or executed in an order other than that described herein.

If an exemplary embodiment comprises an "and/or" conjunction between a first feature and a second feature, this can be read to mean that the exemplary embodiment according to one embodiment includes both the first feature and the second feature, and according to another embodiment contains either just the first feature or just the second feature.

REFERENCE SYMBOLS 100 electronics module
102 carrier element
104 first power switch element
106 first cooling surface
108 second power switch element
110 second cooling surface
112 third power switch element
114 third cooling surface
118 soldering point
120 first contact surface
122 cooling plate
124 second contact surface
126 heat sink
128 connecting element
200 housing
202 insulating layer
300 method for producing an electronics module
310 placement step
320 thermally conductive connecting step

The invention claimed is:

1. An electronics module for power control, wherein the electronics module comprises the following features:
   a carrier element;
   a first power switch element electrically coupled to the carrier element, the first power switch element having a first cooling surface facing away from the carrier element;
   a second power switch element electrically coupled to the carrier element, the second power switch element having a second cooling surface facing away from the carrier element;
   a heat sink; and
   a cooling plate that connects the first cooling surface and the second cooling surface to one another as well as to the heat sink in a thermally conductive manner, wherein the cooling plate is electrically conductive between a location where the cooling plate connects to the first cooling surface and a location where the cooling plate connects to the second cooling surface.

2. The electronics module according to claim 1, wherein the first power switch element and the second power switch element each comprise at least one of a MOSFET, IGBT or thyristor.

3. The electronics module according claim 1, wherein the cooling plate at least one of comprises mostly copper or comprises copper as a main component.

4. The electronics module according to claim 1, further comprising:
   a connecting element comprising a filler material with a predefined thermal resistance, wherein the connecting element connects the cooling plate and the heat sink to one another in a thermally conductive manner.

5. The electronics module according to claim 4, further comprising:
   an electrically insulating layer that connects the connecting element and the heat sink to one another in a thermally conductive manner.

6. The electronics module according to claim 4, wherein the connecting element has a predetermined elasticity and is compressed by a pressure between the cooling plate and the heat sink.

7. The electronics module according to claim 1, wherein the cooling plate is materially bonded to the first cooling surface and the second cooling surface by at least one of soldering or an adhesive.

8. The electronics module according to claim 1, further comprising:
   a housing for accommodating the electronics module.

9. The electronics module according to claim 8, wherein the heat sink is part of the housing.

10. The electronics module according to claim 8, wherein the housing is formed of a housing material that is sprayed onto the electronics module.

11. The electronics module according claim 2, wherein the cooling plate at least one of comprises mostly copper or comprises copper as a main component.

12. The electronics module according to claim 2, further comprising:
   a connecting element comprising a filler material with a predefined thermal resistance, wherein the connecting element connects the cooling plate and the heat sink to one another in a thermally conductive manner.

13. The electronics module according to claim 3, further comprising:
   a connecting element comprising a filler material with a predefined thermal resistance, wherein the connecting element connects the cooling plate and the heat sink to one another in a thermally conductive manner.

14. The electronics module according to claim 4, wherein the connecting element is electrically conductive.

15. The electronics module according to claim 3, wherein the cooling plate is materially bonded to the first cooling surface and the second cooling surface by at least one of soldering or an adhesive.

16. The electronics module according to claim 3, further comprising:
   a housing for accommodating the electronics module.

17. The electronics module according to claim 8, wherein a surface section of the heat sink facing away from the carrier element is exposed through an exterior surface of the housing.

18. The electronics module according to claim 17, wherein the housing is formed of a housing material that is sprayed onto the electronics module.

19. The electronics module according to claim 5, wherein the insulating layer comprises a metallic oxide layer.

20. The electronics module according to claim 1, wherein the carrier element comprises a printed circuit board (PCB).

* * * * *